(12) United States Patent
Liu et al.

(10) Patent No.: US 8,582,079 B2
(45) Date of Patent: Nov. 12, 2013

(54) USING PHASE DIFFERENCE OF INTERFERENCE LITHOGRAPHY FOR RESOLUTION ENHANCEMENT

(75) Inventors: Kuo-Shih Liu, Fremont, CA (US); Rudolf Hendel, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 620 days.

(21) Appl. No.: 11/838,363

(22) Filed: Aug. 14, 2007

(65) Prior Publication Data
US 2009/0046263 A1 Feb. 19, 2009

(51) Int. Cl.
G03B 27/44 (2006.01)
G03B 27/54 (2006.01)
G03B 27/32 (2006.01)
G03B 27/42 (2006.01)

(52) U.S. Cl.
USPC ............... 355/46; 355/53; 355/67; 355/68; 355/77

(58) Field of Classification Search
USPC .............. 355/7–71, 776; 250/492.1, 492.2, 250/492.22, 493, 548; 430/30, 311, 394, 5, 430/8, 22, 312, 321; 359/257, 577–579
See application file for complete search history.

(56) References Cited

U.S. PATENT DOCUMENTS

| | | | |
|---|---|---|---|
| 4,402,571 A | 9/1983 | Cowan et al. | |
| 4,496,216 A * | 1/1985 | Cowan | 359/566 |
| 4,568,631 A | 2/1986 | Badami et al. | |
| 4,734,345 A | 3/1988 | Nomura et al. | |
| 5,142,385 A * | 8/1992 | Anderson et al. | 359/10 |
| 5,298,365 A | 3/1994 | Okamoto et al. | |
| 5,369,464 A * | 11/1994 | Kamon | 355/43 |
| 5,415,835 A * | 5/1995 | Brueck et al. | 430/311 |
| 5,705,321 A | 1/1998 | Brueck et al. | |
| 5,739,898 A | 4/1998 | Ozawa et al. | |
| 5,759,744 A | 6/1998 | Brueck et al. | |
| 5,822,479 A * | 10/1998 | Napier et al. | 385/37 |
| RE36,113 E | 2/1999 | Brueck et al. | |
| 6,088,505 A * | 7/2000 | Hobbs | 385/147 |

(Continued)

FOREIGN PATENT DOCUMENTS

| | | |
|---|---|---|
| GB | 2171530 A | 8/1986 |
| JP | 63-106778 | 5/1988 |
| WO | WO 2008/030025 A1 | 3/2008 |

OTHER PUBLICATIONS

PCT International Search Report and Written Opinion mailed Nov. 7, 2008, International Application No. PCT/US2008/074838, 8 pages.

(Continued)

*Primary Examiner* — Toan Ton
*Assistant Examiner* — Christina Riddle
(74) *Attorney, Agent, or Firm* — Kilpatrick Townsend & Stockton LLP

(57) ABSTRACT

Interference lithography (IL) system and methods are disclosed according to embodiments of the invention. Two beams of coherent light with a first phase difference expose a first interference pattern on a nonlinear photoresist. A second interference pattern may be exposed on the nonlinear photoresist using the same coherent light beams with a second phase difference. The difference between the first and second phase differences is between 70° and 270°. The ensuing pattern is a composite of the first and second interference patterns. The IL may employ a third and fourth light beam.

28 Claims, 10 Drawing Sheets

(56) References Cited

U.S. PATENT DOCUMENTS

| | | | |
|---|---|---|---|
| 6,218,057 B1 | 4/2001 | Cirelli et al. | |
| 6,233,044 B1 | 5/2001 | Brueck et al. | |
| 6,239,909 B1 * | 5/2001 | Hayashi et al. | 359/569 |
| 6,252,665 B1 * | 6/2001 | Williams et al. | 356/450 |
| 6,255,038 B1 | 7/2001 | Hobbs | |
| 6,304,318 B1 * | 10/2001 | Matsumoto | 355/55 |
| 6,344,892 B1 | 2/2002 | Sugita et al. | |
| 6,522,433 B2 | 2/2003 | Kelsey et al. | |
| 6,556,280 B1 * | 4/2003 | Kelsey et al. | 355/71 |
| 6,677,601 B2 * | 1/2004 | Shiraishi | 250/559.29 |
| 6,703,328 B2 | 3/2004 | Tanaka et al. | |
| 6,780,574 B2 | 8/2004 | Kawashima | |
| 6,807,662 B2 | 10/2004 | Toublan et al. | |
| 6,818,389 B2 | 11/2004 | Fritze et al. | |
| 6,882,477 B1 * | 4/2005 | Schattenburg et al. | 359/577 |
| 7,055,127 B2 | 5/2006 | Pierrat et al. | |
| 7,122,281 B2 | 10/2006 | Pierrat | |
| 7,142,282 B2 | 11/2006 | Borodovsky | |
| 7,561,252 B2 * | 7/2009 | Sewell et al. | 355/67 |
| 7,642,041 B2 * | 1/2010 | Wago | 430/321 |
| 2001/0008742 A1 * | 7/2001 | Jen et al. | 430/311 |
| 2002/0031725 A1 * | 3/2002 | Sugita et al. | 430/311 |
| 2002/0094483 A1 * | 7/2002 | Hattori et al. | 430/5 |
| 2002/0145712 A1 | 10/2002 | Kochi | |
| 2002/0149751 A1 * | 10/2002 | Bloomstein et al. | 353/122 |
| 2003/0123040 A1 * | 7/2003 | Almogy | 355/69 |
| 2003/0165749 A1 | 9/2003 | Fritze et al. | |
| 2004/0090194 A1 | 5/2004 | Gesley | |
| 2004/0110092 A1 * | 6/2004 | Lin | 430/311 |
| 2004/0259042 A1 | 12/2004 | Fritze et al. | |
| 2005/0064297 A1 * | 3/2005 | Wago | 430/5 |
| 2005/0073671 A1 | 4/2005 | Borodovsky | |
| 2005/0074698 A1 | 4/2005 | Borodovsky | |
| 2005/0083497 A1 | 4/2005 | Borodovsky | |
| 2005/0085085 A1 | 4/2005 | Borodovsky | |
| 2005/0088633 A1 | 4/2005 | Borodovsky | |
| 2005/0160383 A1 | 7/2005 | Lin | |
| 2005/0238965 A1 | 10/2005 | Tyrrell et al. | |
| 2005/0266323 A1 | 12/2005 | Raulea | |
| 2006/0017910 A1 | 1/2006 | Borodovsky | |
| 2006/0046156 A1 * | 3/2006 | Amako et al. | 430/1 |
| 2006/0046160 A1 | 3/2006 | Wallace et al. | |
| 2006/0216651 A1 | 9/2006 | Ho et al. | |
| 2006/0274295 A1 | 12/2006 | Brueck et al. | |
| 2007/0139633 A1 | 6/2007 | Bleeker et al. | |
| 2009/0111056 A1 | 4/2009 | Hendel et al. | |
| 2009/0117491 A1 | 5/2009 | Hendel et al. | |
| 2010/0002210 A1 | 1/2010 | Hendel et al. | |

OTHER PUBLICATIONS

PCT International Search Report and Written Opinion mailed Nov. 24, 2008, International Application No. PCT/US08/74843, 8 pages.

PCT International Search Report and Written Opinion mailed Nov. 19, 2008, International Application No. PCT/US08/74840, 8 pages.

Fritze, M. et al., "High-Throughput Hybrid Optical Maskless Lithography: All-Optical 32-nm Node Imaging," Emerging Lithographic Technologies IX, edited by Scott Mackay, Proceedings of the SPIE, vol. 5751, (SPIE, Bellingham, WA, 2005), pp. 1058-1068.

Ehrlich, D. J. et al., "Submicrometer Patterning By Projected Excimer-Laser-Beam Induced Chemistry," J. Vac. Sci. Technol. B, vol. 3, No. 1, pp. 1-8, Jan./Feb. 1985.

Farsari, M. et al., "Fabrication Of Three-Dimensional Structures By Three-Photon Polymerization," Optics Letters, vol. 30, No. 23, pp. 3180-3182, Dec. 1, 2005.

Gelbart, Dan et al., "UV Thermoresists: Sub 100nm Imaging Without Proximity Effects," SPIE, vol. 3676, pp. 786-793, Mar. 1999.

Lin, Chih-Lang et al., "Velocimetry Microsensors Driven By Linearly Polarized Optical Tweezers," Optics Letters, vol. 31, No. 3, pp. 329-331, Feb. 1, 2006.

Pang, S. W. et al., "Aluminum Oxides As Imaging Materials For 193-nm Excimer Laser Lithography," J. Vac. Sci. Technol. B., vol. 7, No. 6, pp. 1624-1628, Nov./Dec. 1989.

Poonawala, Amyn et al., "ILT For Double Exposure Lithography With Conventional And Novel Materials," Proc. of SPIE, vol. 6520, pp. 65202Q-1-65202Q-14, 2007.

Rothschild, M. et al., "A Review Of Excimer Laser Projection Lithography," J. Vac. Sci. Technol. B, vol. 6, No. 1, pp. 1-17, Jan./Feb. 1988.

Van den hove, Luc et al., "Lithography Options For The 32nm Half Pitch Node," imec, 50 pages, 2006.

Walsh, Michael E., "Nanostructuring Magnetic Thin Films Using Interference Lithography," Massachusetts Institute of Technology, 86 pages, Aug. 2000.

Walsh, Michael E., "On The Design Of Lithographic Interferometers And Their Application," Massachusetts Institute of Technology, 300 pages, Sep. 2004.

Yin, Xiaobo et al., "Near-Field Two-Photon Nanolithography Using An Apertureless Optical Probe," Applied Physics Letters, vol. 81, No. 19, pp. 3663-3665, Nov. 4, 2002.

PCT International Search Report mailed Oct. 22, 2008; International Application No. PCT/US08/72909; 9 pages.

* cited by examiner

USING PHASE DIFFERENCE OF INTERFERENCE LITHOGRAPHY FOR RESOLUTION ENHANCEMENT

BACKGROUND OF THE INVENTION

Optical resolution for lithography is determined by Rayleigh's equation. For the state of the art ArF lithography systems, the optical resolution is limited to 63 nm half pitch (HP) with a numerical aperture (NA) of 0.93 and $K_1$ factor at 0.3.

Immersion lithography has also been proposed. Immersion lithography techniques replace the usual air gap between the final lens and a wafer surface with a liquid medium that has a refractive index greater than one. In such systems, the resolution may be reduced by a factor equal to the refractive index of the liquid. Current immersion lithography tools use highly purified water for the immersion liquid, and can achieve feature sizes below the Rayleigh limit. Immersion lithography, however, suffers from various manufacturing defects, such as, water marks, drying stains, water leaching, wafer edge peeling, and air bubbles that restrict full scale manufacturing efforts. Current development focuses on various manufacturing techniques that avoid these negative effects. The optical resolution for water-immersion lithography with an NA of 1.35 and $K_1$ factor of 0.3 is limited to 42 nm HP, per Rayleigh's equation. Further research is being conducted to seek lens materials, immersion fluids and photoresists with higher index of refraction to further reduce the resolution limit. However, few breakthroughs have been reported making it an unlikely candidate as the technology of choice for the next generation lithography.

Currently, there are a number of lithography techniques under development that seek to provide optical resolution below the Rayleigh limit. For example, some have suggested employing a double patterning technique. Such a system may employ two exposures on two photoresist layers. There are technical challenges to employing a double patterning technique; for instance, alignment of the two patterns incident on the photoresist is difficult with current state-of-the-art scanners. Moreover, the process of depositing and etching with two photoresists as well as requiring two exposures increases the operation use of expensive scanners and thin-film processing tools.

Others have suggested using extreme ultraviolet (EUV) lithography as another solution to providing optical resolution below Rayleigh's limit for 193 nm optical lithography. Systems currently under development use 13.5 nm wavelength light sources. Various problems must be resolved before EUV lithography can be implemented; for example, low source power, contamination issues, and manufacturing and handling masks. These challenges have limited EUV lithography as a viable solution to optical resolutions below the Rayleigh limit.

Accordingly, there remains a general need in the art for a optical lithography system that can provide optical resolution below the Rayleigh limit.

BRIEF SUMMARY OF THE INVENTION

An interference lithography (IL) system is disclosed according to one embodiment of the invention. The IL system may include a Mach-Zehnder interferometer according to one embodiment of the invention. In another embodiment of the invention, the IL system may also include a nonlinear photoresist, an optical source, an optical splitter, a plurality of mirrors, a phase difference sensor and a Pockels cell. The light source may produce a beam of substantially coherent light. The optical splitter may be disposed within the path of the beam of coherent light and split the beam of coherent light into a plurality of beams of substantially coherent light. The plurality of mirrors may each reflect a beam of light from the plurality of beams of light towards the nonlinear photoresist. The phase difference sensor detects the phase difference between the plurality of beams of substantially coherent light.

The Pockels cell may be disposed within the optical path of at least one of the plurality of beams of substantially coherent light and may be in communication with the phase difference sensor such that the phase difference sensor communicates a phase error to the Pockels cell. Moreover, the Pockels cell may comprises a material that lacks certain symmetric properties, for example, where the index of refraction of the material varies according to an applied voltage. The Pockels cell may also place at least two of the plurality of beams of substantially coherent light in phase or substantially 180° out of phase.

The IL system may also include control logic in communication with the phase difference sensor and the Pockels cell. The control logic may receive the phase error from the phase difference sensor and control the Pockels cell as needed to adjust the phase error. The control logic may also calculate the proper phase change and the proper voltage to apply to the Pockels cell in order to produce the proper phase change.

According to various embodiments of the invention, the IL system may also include an aluminum oxide photoresist. The coherent light source may include an excimer laser as the light source. Other lasers or light sources may also be used, for example, an LED or a mercury lamp. The beam splitter may produce two, three, four or more beams of coherent light (e.g., see 104A in FIG. 1A).

A method for exposing a nonlinear photoresist using an interferometer is disclosed according to another embodiment of the invention. The method may include exposing a nonlinear photoresist with a first coherent light beam and a second coherent light beam for a set period of time. The phase difference between the first coherent light beam and the second coherent light beam is a first phase difference. Whereupon the method adjusts the phase of either the first or second light beam such that the phase difference between the two beams comprises a second phase difference. In one embodiment the difference between the first phase difference and second phase difference is 180° In another embodiment the difference between the two phase differences is 90° to 270°. Once the phase has been adjusted the method exposes the nonlinear photoresist with the first coherent light beam and the second coherent light beam.

The method may further include, according to another embodiment of the invention, measuring the phase difference between the first and second light beam; calculating the voltage required to adjust the phase difference using a Pockels cell; and providing the calculate voltage to a Pockels cell. The method may also include, according to another embodiment of the invention, providing a coherent light source; and splitting the coherent light source into the first coherent light beam and the second coherent light beam.

Another method for exposing a nonlinear photoresist using an interferometer is disclosed according to another embodiment of the invention. The method may include providing a coherent light source, splitting the coherent light source into two light beams and measuring the first phase difference between the two light beams. The two light beams may then expose a nonlinear photoresist for a first time period. Whereupon the phase difference between the two light beams is adjusted to a second phase difference. The difference between the first phase difference and the second phase difference may be between 90° and 270°. After the phase is adjusted, the two light beams may expose a nonlinear photoresist for a second time period. The first and second exposures may expose the photoresist with equal periods of time. The difference between the phase differences may depend on the exposure times. During the first exposure the phase difference, for example, may be adjusted to 0°. During the second exposure the phase difference may be adjusted to 180°.

A method for exposing a nonlinear photoresist using an interferometer is disclosed according to another embodiment of the invention. The method may include providing a nonlinear photoresist and exposing the nonlinear photoresist with light from two coherent light beams that are out of phase by a first phase difference. The method may then expose the nonlinear photoresist with light from the two light beams that are out of phase by a phase difference that is 180° or any other large phase difference, from the previous phase difference.

A method for exposing a nonlinear photoresist using a four beam interferometer is disclosed according to another embodiment of the invention. According to this method four beams of light are interfere on a nonlinear photoresist. The first and third beams of light are within a first plane that is orthogonal to a plane defining the second and fourth beams of light. The nonlinear photoresist may be exposed two, three, four or more times. In one specific embodiment, the nonlinear photoresist may be exposed with light where the phase difference between the first and third beams of light is $\Delta\phi_1^{13}$ and the phase difference between the second and fourth beams of light is $\Delta\phi_1^{24}$. A second exposure may have phase differences of $\Delta\phi_2^{13}=\Delta\phi_1^{13}+180°$ and $\Delta\phi_2^{24}=\Delta\phi_1^{24}+180°$.

Another embodiment of the invention may use four exposures. The phase differences of the one of the other exposures may be $\Delta\phi_2^{13}=\Delta\phi_1^{13}+180°$ and $\Delta\phi_2^{24}=\Delta\phi_1^{24°}$. The phase differences of another exposure may be $\Delta\phi_2^{13}=\Delta\phi_1^{13}+180°$ and $\Delta\phi_2^{24}=\Delta\phi_1^{24°}+180°$. The phase differences of the one of the other exposures may be $\Delta\phi_2^{13}=\Delta\phi_1^{13}$ and $\Delta\phi_2^{24}=\Delta\phi_1^{24°}+180°$. Various other differences between phase difference in exposures may be used.

DETAILED DESCRIPTION OF THE INVENTION

The ensuing description provides preferred exemplary embodiment(s) only and is not intended to limit the scope, applicability or configuration of the disclosure. Rather, the ensuing description of the preferred exemplary embodiment(s) will provide those skilled in the art with an enabling description for implementing a preferred exemplary embodiment. It should be understood that various changes may be made in the function and arrangement of elements without departing from the spirit and scope as set forth in the appended claims.

Figure 1:
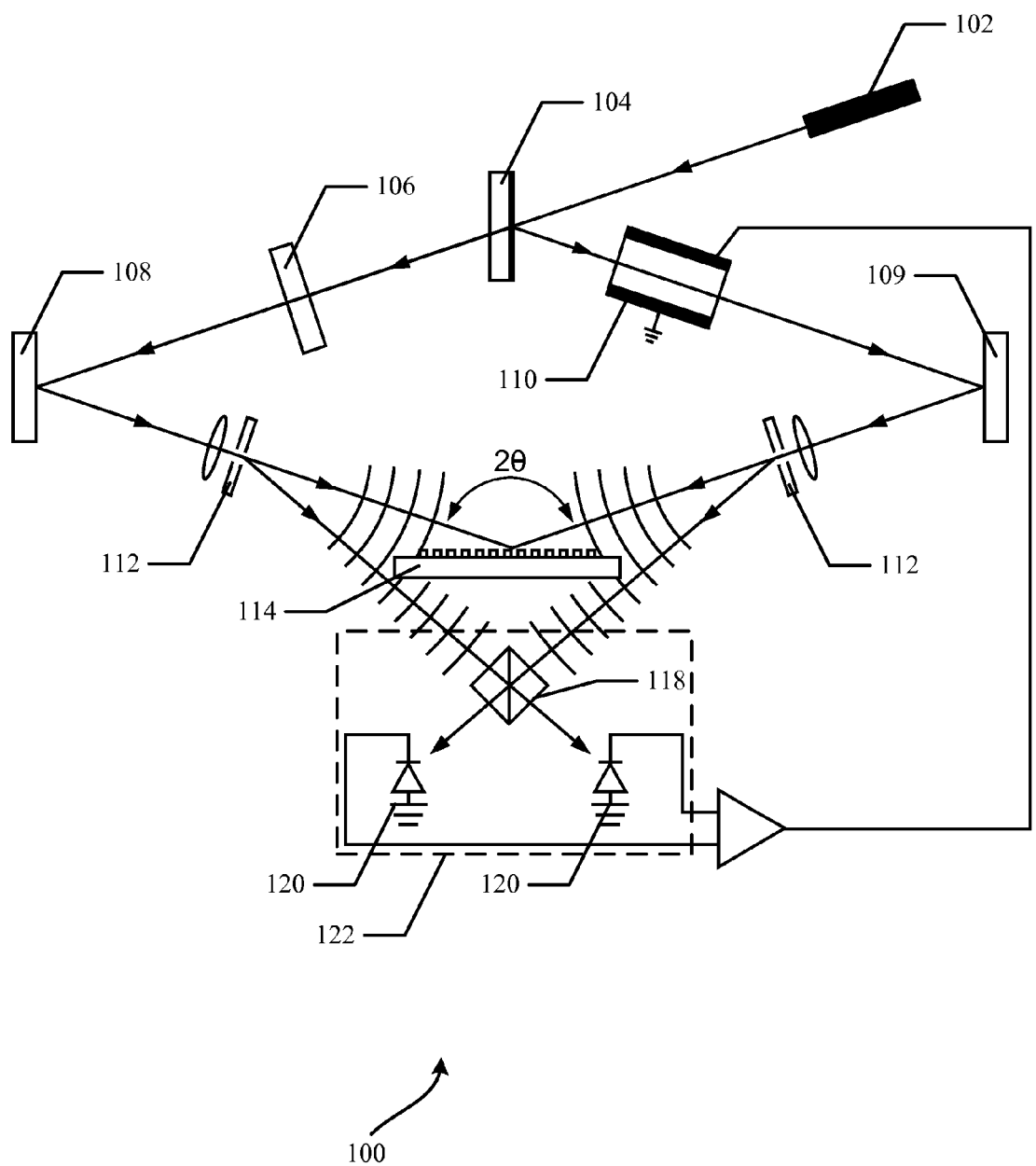
FIG. 1 shows a block diagram of an interference lithography system according to one embodiment of the invention.

FIG. 1 shows a block diagram of an interference lithography system 100 according to one embodiment of the invention. A laser 102 produces a coherent light beam that is split at a beam splitter 104 into two beams. The laser 102, for example, may comprise an excimer laser. Various other light sources may also be used, for example LEDs broadband sources with a filter, etc. Other light sources may include UV light source from gas-charged lamps such as Hg-lamp at g-line (436 nm) and i-line (365 nm), or EUV light sources at 13.5 nm wavelength from a magnetron or Tin plasma.

Excimer lasers may produce light at various ultraviolet wavelengths. For example, an excimer laser may include an $Ar_2$ laser producing light with a wavelength of 126 nm, a $Kr_2$ laser producing light with a wavelength of 146 nm, an $F_2$ laser producing light with a wavelength of 157 nm, an $Xe_2$ laser producing light with a wavelength of 172 or 175 nm, an ArF laser producing light with a wavelength of 193 nm, a KrF laser producing light with a wavelength of 248 nm, an XeBr laser producing light with a wavelength of 282 nm, an XeCl laser producing light with a wavelength of 308 nm, an XeF laser producing light with a wavelength of 351 nm, a $CaF_2$ laser producing light with a wavelength of 193 nm, a KrCl laser producing light with a wavelength of 222 nm, a $Cl_2$ laser producing light with a wavelength of 259 nm, or a $N_2$ laser producing light with a wavelength of 337 nm. Various other lasers operating in other spectral bands may also be used with deviating from the scope of the present invention. The various embodiments of the invention will be described using an ArF excimer laser that produces light at 193 nm.

The two beams created at the beam splitter 104 are reflected toward a target 114 using two mirrors 108, 109. Absent a substrate or other material, the target 114 may be a process chuck. The target may hold a substrate or other material. The beam splitter 104, may include any light splitting element, such as a prism or diffraction grating. The two beams interfere constructively and destructively at the target 114 creating an interference pattern at the target 114. The position of the interference pattern may depends on the phase difference of the two beams. The angle θ is the angle of incidence of a single beam with respect to the normal of the target 114. The angle 2θ is the angle between the two beams at the substrate.

Spatial filters 112 may be included along each beam path. These spatial filters 112 may expand the beams for dose uniformity over a large area. Moreover, the spatial filters 112 may be used to remove spatial-frequency noise from the beams. Due to the potential of relatively long propagation distances (~1 m) and the lack of additional optics after the spatial filer, the beams interfering at the substrate can be accurately approximated as spherical. Other optical elements may be employed throughout the optical paths of the two beams of light.

The spatial position of the interference fringes is determined by the relative phase of the beams, which makes this type of interferometer extremely sensitive to path length differences between the two arms. For this reason, a phase difference sensor 122 may be employed in conjunction with a Pockels cell 110 in one arm of the interference lithography system 100. The phase difference sensor 122 may include another beam splitter 118 and two photodiodes 120. Differential changes in the intensity on the photodiodes 120 may be converted into phase differences. The phase difference may then be adjusted at the Pockels cell 110. A variable attenuator 106 in the arm that does not have the Pockels cell 110 may be employed to balance any power lost through the Pockels cell 110.

The Pockels cell 110 may include any device that includes a photo refractive electro-optic crystal and/or a piezoelectric element that can change the polarization and/or phase of a light beam in response to an applied voltage. The phase may be changed by varying the index of refraction of the Pockels cell in response to the applied voltage. When a voltage is applied to this crystal it can change the phase of the light beam. In some Pockels cells, the voltage, V, required to induce a specific phase change, $\phi$, can be calculated, for example, by the following equation:

$$V = \frac{\phi}{\pi} V_{\frac{\lambda}{2}}, \text{ where } V_{\frac{\lambda}{2}}$$

is the half wavelength voltage, which depends on the wavelength, $\lambda$, of the light beam passing through the Pockels cell. The Pockels cell may comprise, for example, an oxide of bismuth and germanium or of bismuth and silicon. Most importantly, the Pockels cell may include any device or material that may tune the phase of light in the presence of an applied voltage.

The Pockels cell may be replaced with an optical element that varies the optical path distance through the optical element. The optical path distance through the optical element may be change by rotating the optical element or by flexing the width of the optical element. The optical path distance may change using a mechanical devices or piezoelectrics. To induce a 180° phase change, for example, the optical element should increase the optical path distance by:

$$d = \frac{\lambda}{2n},$$

where n is the index of refraction of the optical element. Accordingly, change in distance by either rotating the optical element or flexing is a fraction of the wavelength of the light beam passing through the optical element.

In various embodiments of the invention, the phase difference between the first exposure and the second exposure is not necessarily 180°. For example, a phase difference of 120° may be used between three exposures. Moreover, a phase difference of 90° may be used between four exposures. In other embodiments, various other phase differences between various exposures may be used to vary the width or placement of exposed portions of the nonlinear photoresist.

The Pockels cell may be used to align the phases of the two light beams within the interferometer as well as to adjust the phase difference between the two light beams so that they are 180° out of phase.

Figure 2A:
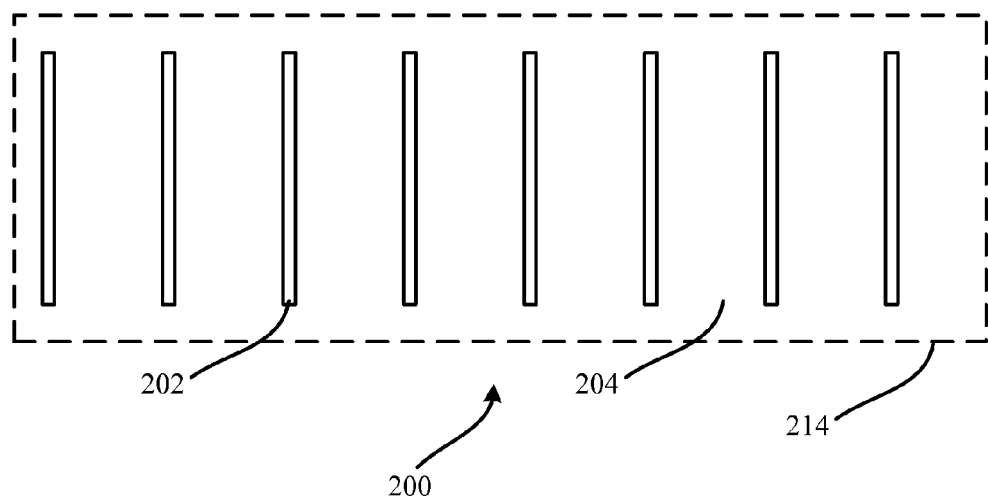
FIG. 2A shows a representation of a latent or real image of an interference pattern of lines (exposed to light) and spaces (not exposed to light) produced by an interference lithography apparatus 1 according to one embodiment of the invention.

FIG. 2A illustrates a latent or real image of an interference pattern 200 of spaces 204 (exposed to light) and lines 202 (not exposed to light) produced by the interference lithography apparatus 100 of FIG. 1 on the surface of the target 214. "Latent" refers to a pattern on a photoresist which experienced a chemical reaction due to radiation but has not yet been developed in a solution to remove the exposed areas of the positive tone photoresist. The lines 202 have a substantially equal width. The spaces 204 may or may not have a width equal to the width of the lines 202.

The pitch is a sum of a line width 202 and a space width 204 as shown in FIG. 2A. The half pitch (HP) is a measure of the minimum pitch which can be resolved by a projection optical exposure apparatus with a pre-determined wavelength $\lambda$ and numerical aperture (NA). HP may be expressed as:

$$HP = \frac{\left(k_1 \frac{\lambda}{n}\right)}{NA}$$

where NA is the numerical aperture of a projection lens in the lithography tool, $n_1$ is the refractive index of a media between the substrate and the last element of the optical projection system, and $k_1$ is Rayleigh's constant. Some optical projection systems currently in use for microlithography use air, for which $n_1=1$. For liquid immersion microlithographic systems, $n_1>1.4$. For $n_1=1$, HP may be expressed as:

$$HP = \frac{k_1 \lambda}{NA}.$$

Using an ArF excimer laser the wavelength, $\lambda$, is 193 nm. A minimum $k_1$ value is approximately 0.28 and the NA may be approximately 1. Accordingly, the smallest HP achievable with such a system may be approximately 54 nm and is often referred to as Rayleigh's limit. Other systems employing such things as immersion lithography may bring HP near 32 nm. Embodiments of the present invention may provide an HP less than 32 nm.

In another embodiment of the present invention, the target 114 includes a photoresist with nonlinear, super-linear or memoryless properties. Such a photoresist may have a limited response period. The photoresist may be a thermal photoresist. The terms memoryless photoresist, nonlinear photoresist, super-linear photoresist, and thermal photoresist may be used interchangeably throughout this disclosure despite not being perfectly synonymous. Such photoresists may be broadly characterized by the fact that the photoresist does not integrate energies of consecutive exposures, as long as none of the energy exceeds a threshold, and there is time period (or sufficient cool-down time) between them. Moreover, nonlinear photoresists may only integrate energies of incident light as long as the incident light exceeds a threshold.

The intensity of light, $I_{12}$, incident at the target 114 using the interferometer shown in FIG. 1 can be written as:

$$I_{12} = I_1 + I_2 + 2(\vec{E}_1 \cdot \vec{E}_2)\cos\left[(\vec{k}_1 - \vec{k}_2) \cdot \vec{r} + \Delta\phi\right],$$

where $I_1$ and $I_2$ are the intensities of light from the first and second arms of the interferometer, $\vec{E}_1$ and $\vec{E}_2$ are the first and second electric fields associated with the incident light, and $\vec{k}_1$ and $\vec{k}_2$ are the respective wave vectors. Furthermore, $\vec{r}$ is the position vector and $\Delta\phi$ is the phase difference of the two incident beams of light. Intensity maxima is found when the cosine term equals zero:

$$(\vec{k}_1 - \vec{k}_2) \cdot \vec{r} + \Delta\phi = 0.$$

Figure 2B:
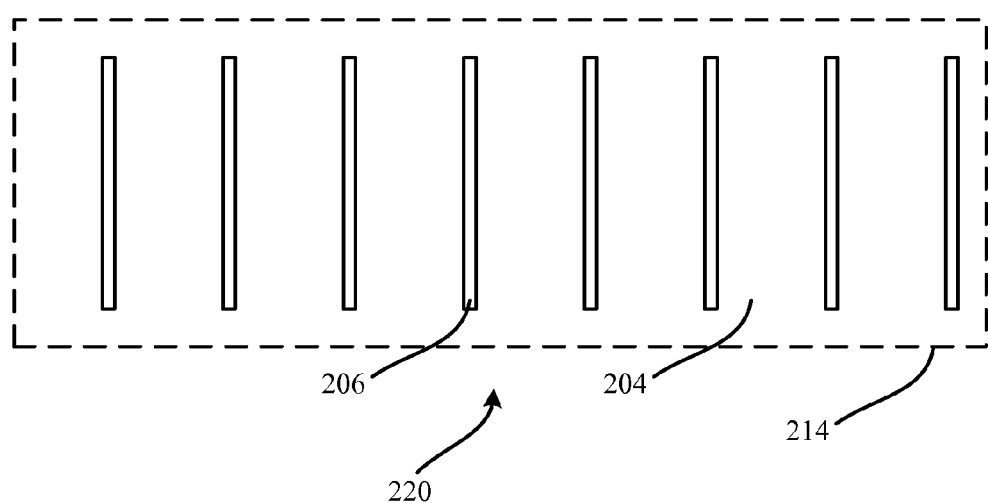
FIG. 2B shows a representation of a latent or real image of an interference pattern of lines (exposed to light) and spaces (not exposed to light) produced by the interference lithography apparatus where the interference lithography apparatus is 180° out of phase from the lines shown in FIG. 2A according to one embodiment of the invention.

FIG. 2A shows an interference pattern 200 on a nonlinear photoresist when, for example, the phase difference is equal to zero: $\Delta\phi=0$. The interference pattern 200 includes a series of lines 202 where the photoresist is not exposed to light and a series of spaces 204 where the photoresist is exposed to light with a positive photoresist and vice-versa with a negative photoresist. FIG. 2B shows an interference pattern 220 when the phase difference between the two beams is 180° out of phase: $\Delta\phi=180$. By inducing a phase difference of 180°, the interference pattern is shifted so that the lines 206 are placed directly between the lines 202. By carefully controlling the phase difference between the two incident beams of light so that a second exposure uses a phase difference that is 180° different from the first phase difference the interferometer may expose the surface of the target 214 as shown in FIG. 2C.

Figure 2C:
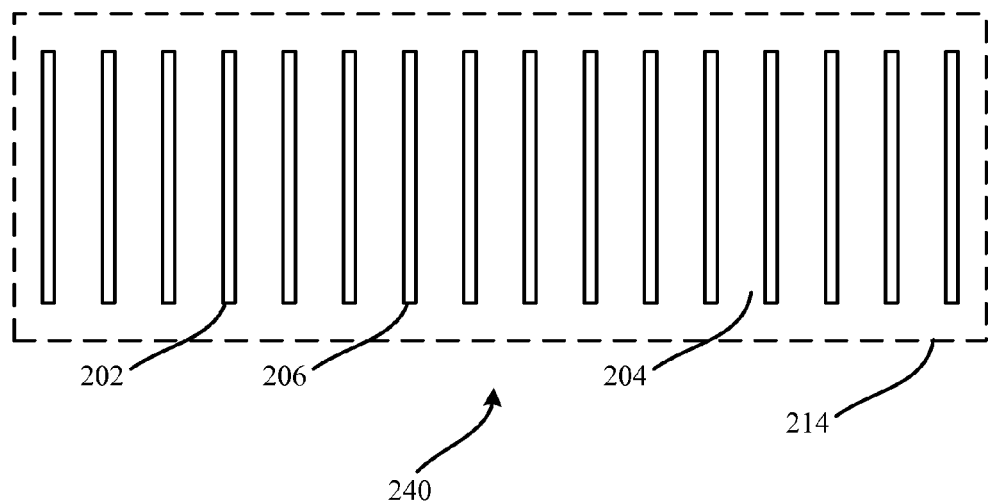
FIG. 2C shows a combination of the latent or real images of interference patterns shown in FIG. 2A and FIG. 2B according to one embodiment of the invention.

The interferometer shown in FIG. 1 may be used to expose a photoresist as shown in FIGS. 2A, 2B and 2C. For example, the phase difference sensors 122 may be used to determine the phase error between the two beams of light. Once the phase error between the two beams of light is known, the Pockels cell 110 may be used to adjust the phase of one beam of light so that the phase difference between the two beams is zero. Once the phase difference is set to zero, a nonlinear photoresist may be exposed for a set period of time to produce a fine pitch line pattern like the one shown in FIG. 2A. The phase difference may then be adjusted to be 180° and the nonlinear photoresist may be exposed again for a set period of time and exposing the target with the fine pitch line pattern shown in FIG. 2B. The combined affect of exposing the nonlinear photoresist during the two sequences may produce the line pattern 240 shown in FIG. 2C. Of course, embodiments of the invention are not limited to 0° and 180°.

Other phase differences may be used as long as the difference between the two phase differences is 180°. For example, the first phase difference may be 45.2° and the second phase difference may be 125.2°. The first phase difference may be set by calibration of the system and may be based on alignment relative to the location of a substrate on the target. Adjusting the phase may properly align the exposure within the proper filed of view.

The nonlinear photoresist may include any of a number of characteristics. For example, the nonlinear photoresists may be thermoresists. Thermoresists irreversibly change solubility or etch rate when a threshold temperature is reached. This threshold temperature may be reached during exposure from a light source. Thermoresists may be inorganic or organic. Thermoresists may also be ablation-based. For example, co-sputtered Al and $O_2$ is soluble and has low plasma etch resistance. However, when heated the material becomes Alumina ($Al_2O_3$) which is quite durable and etch resistant even at thicknesses as low as 30 mm.

Organic thermoresists, both positive and negative, may be based on cross linking polymers at high temperatures or based on a heat induced chemical change affecting the solubility in a developer. These organic thermoresists have been available from Kodak-Polychrome Graphics, Fuji, Agfa and other sources. These photoresists may be developed in a KOH or NaOH environment. Interestingly, ablation-based thermoresists may obey a linear ablation rate above their threshold. For example, polymide may be used as a thermoresist.

Aluminum oxides $Al_xO_y$ in general may be used as a nonlinear photo resist. Aluminum may be deposited using evaporation within an oxygen rich environment such as $O_2$ in a room temperature environment. Aluminum oxides may change reflectivity and absorption characteristics as the power incident on a film increases above a threshold. The Aluminum oxides may be deposited upon a amorphous carbon layer.

A bleachable layer may also be used as part of a nonlinear photoresist. For example, a bleaching layer may be deposited on a standard photoresist. Initially the bleachable layer has little or no transmittance for small exposure. As the incident light increases so does the bleaching action and the transmittance increases. Accordingly, the bleaching rate is proportional to the incident energy on the bleachable layer. These bleachable layers have also been called contrast enhancement layers. Polydihexisilane, for example, may be uses as a contrast enhancement layer. Those skilled in the art will recognize various other bleachable layers that may be used in conjunction with a photoresist to construct a nonlinear photoresist.

Furthermore, "A Review of Excimer Laser Projection Lithography" by M. Rothschild and D. J. Ehrlich published in the Journal of Vacuum Science and Technology B 6 (1), January/February 1998 discuss a variety of nonlinear photoresists, and is hereby incorporated by reference in it's entirety for all purposes. The paper discusses a variety of materials, for example, organic and inorganic resists, thermoresists, bleachable layers, and ablation materials. Various other nonlinear photoresists, including but not limited to, thermoresists, organic resists, inorganic resists, ablation resists, bleachable layers, contrast enhancement layers, etc may be used. Other nonlinear photo resists may include a two-photon photoresist or any multi-photon photoresist.

Figure 4A:
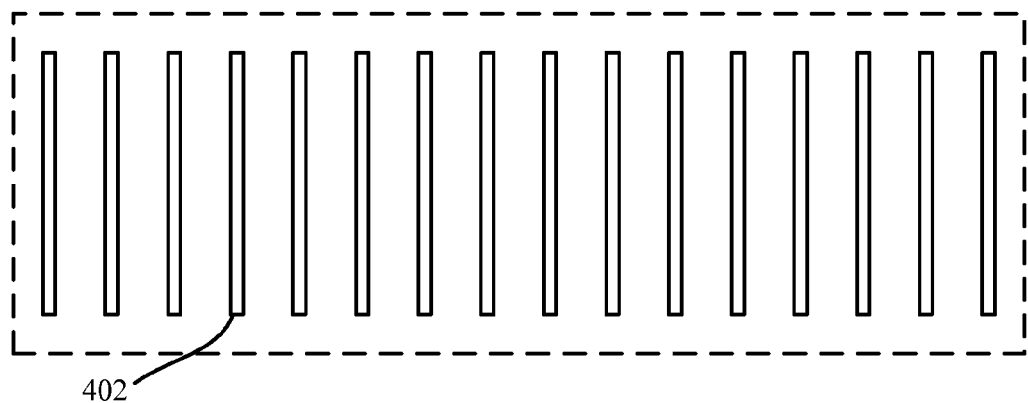
FIGS. 4A, 4B and 4C show how the width of the exposed lines vary with the exposure time and/or the threshold of the nonlinear photoresist according to embodiments of the invention.
Figure 4B:
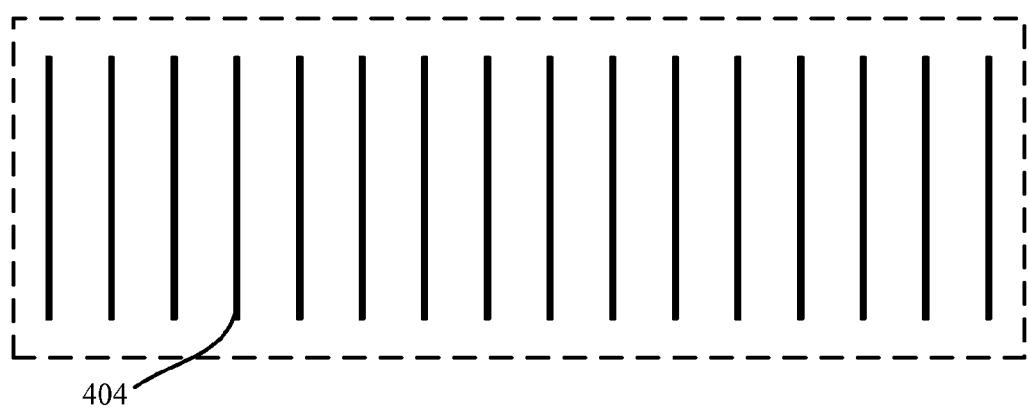
Figure 4C:
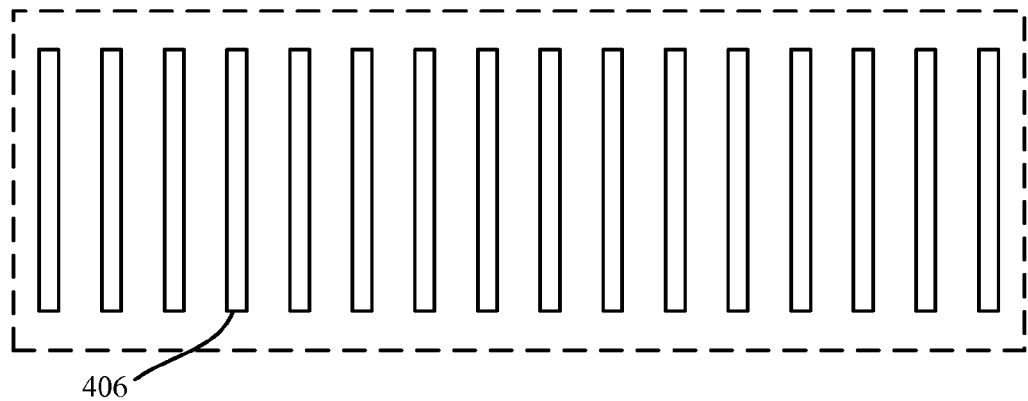

FIGS. 4A, 4B and 4C show how the width of the exposed lines vary with the exposure time and/or the threshold of the nonlinear photoresist according to embodiments of the invention. FIG. 4A shows a latent or real image of an interference pattern of spaces (exposed to light) and lines 402 (not exposed to light) produced by the interference lithography apparatus 100 of FIG. 1 on the surface of the target 214. In this embodiment, exposure by the interference pattern of the interference lithography system produces lines 402. FIG. 4B shows a similar latent or real image with an increase in the exposure time of the light incident on the photoresist. Because of the nonlinear nature of the photoresist, the lines 404 are much narrower. Using a photoresist with a lower threshold may produce the same result. FIG. 4C shows a latent or real image with a decreased exposure time resulting in much thicker lines 406. A photoresist with a higher threshold may also produce the same result. The lines 402, 404, 406 are not drawn to scale, but are rather used figuratively to show how the thickness of the lines may vary according to changes in exposure time and/or photoresist threshold.

Figure 5A:
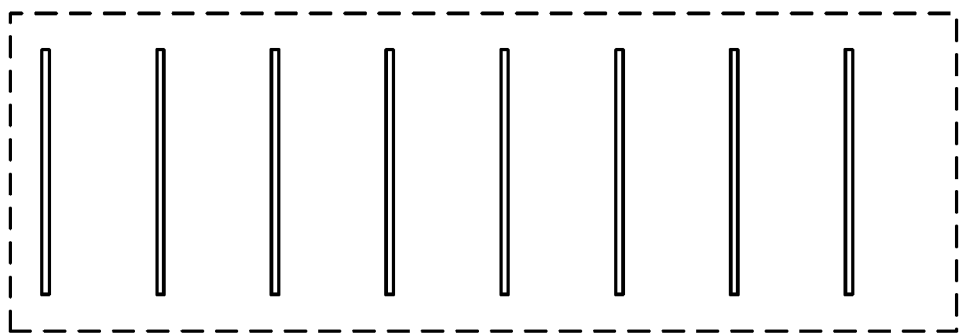
FIGS. 5A, 5B, 5C, 5D and 5E show how four separate exposures can produce a tight pattern according to another embodiment of the invention.
Figure 5B:
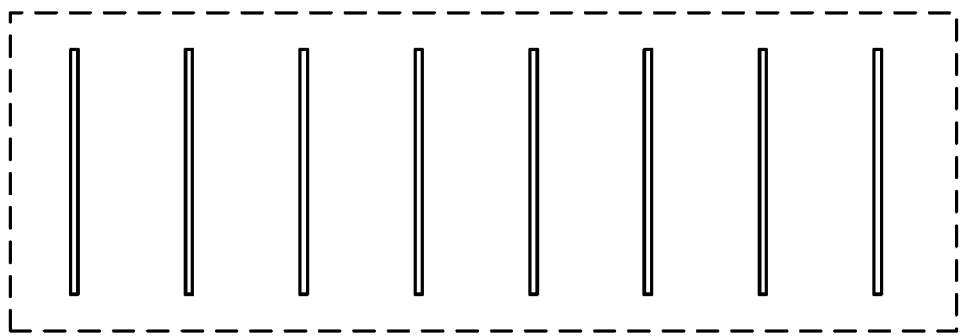
Figure 5C:
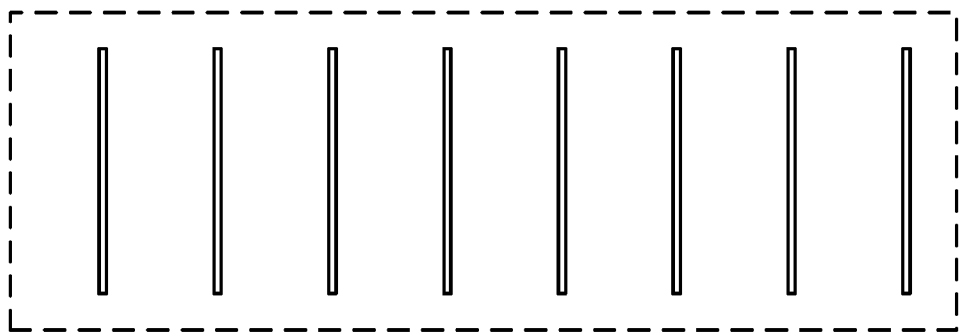
Figure 5D:
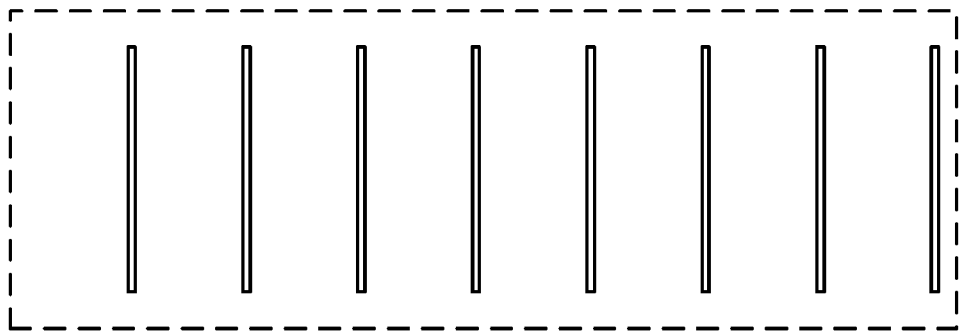
Figure 5E:
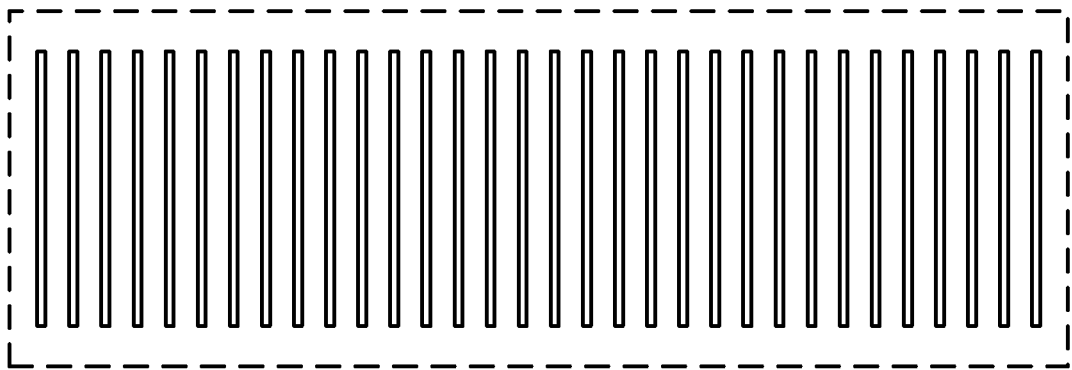

FIGS. 5A, 5B, 5C, 5D and 5E show how four separate exposures can produce a tight pattern using four exposures according to another embodiment of the invention. FIG. 5A shows a first exposure using a two beam interference lithography system. A nonlinear photoresist is exposed for a set period of time and, for example, the two beams have a phase difference of zero ($\Delta\phi_1=0$). FIG. 5B shows a second exposure of the nonlinear photoresist with a phase difference between the two beams of about 90° from the phase difference of the first exposure ($\Delta\phi_2=\Delta\phi_1+90°$. FIG. 5C shows a third exposure of the nonlinear photoresist with a phase difference between the two beams of about 180° from the phase difference of the first exposure ($\Delta\phi_3=\Delta\phi_1+180°$). FIG. 5D shows a fourth exposure of the nonlinear photoresist with a phase difference between the two beams of about 270° from the phase difference of the first exposure ($\Delta\phi_4=\Delta\phi_1+270°$). FIG. 5E shows the combined exposure of the photoresist. Each of the four exposures places a pattern of lines and spaces that are shifted 90° from each other. Of course, more than four exposures may be used. In other embodiments of the invention, 3, 5, 6, 7, 8, 9 and 10 exposures are used. The difference between first phase difference and the nth phase difference is $$\Delta\varphi_n = \Delta\varphi_n + \frac{360°}{n}.$$

Figure 1A:
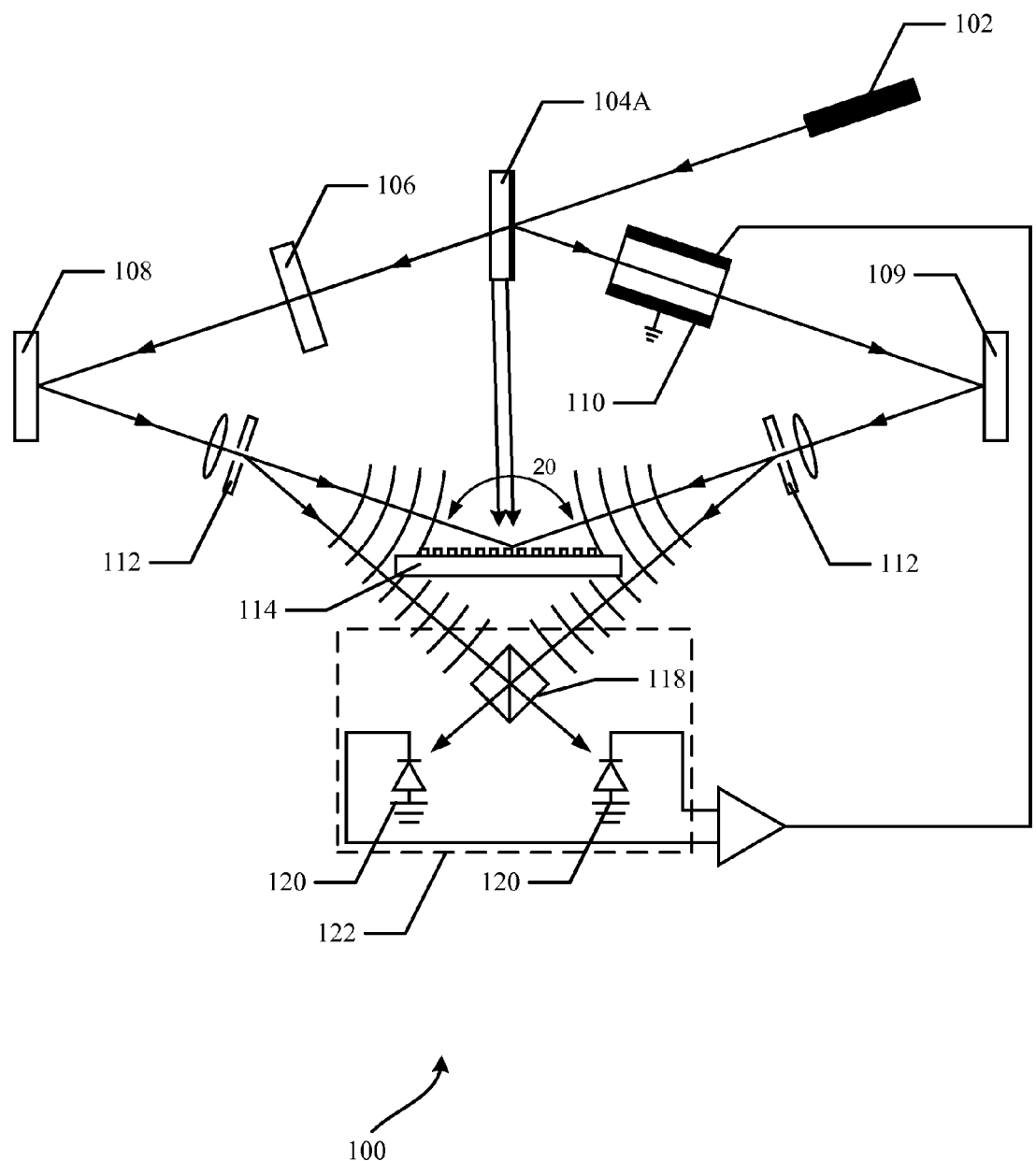
FIG. 1A shows a block diagram of a four beam interference lithography system according to one embodiment of the invention.

FIG. 1A shows an example of a four beam lithography system.

Embodiments of the invention may illuminate the target with spherical non-planar wavefronts. Such wavefronts produce a confocal hyperboloids interference pattern at the target. If the exposure area is small in relation to the phase-radius of the wavefronts, the non-planar wavefronts may not be problematic, because at small exposure areas, the wavefronts approximate to linear wavefronts. Moreover, the spherical wavefronts may also present a fringe inclination that is spatially dependent on the position of the fringe on the target surface. At the center of the fringe pattern the fringe inclination is perpendicular to the surface of the target. To correct for these non-planar wavefront effects, the interferometer may use collimating lenses to linearize each of the beams of light. These collimating lenses may be introduced after the spatial filter 112 as shown in FIG. 1.

Figure 3A:
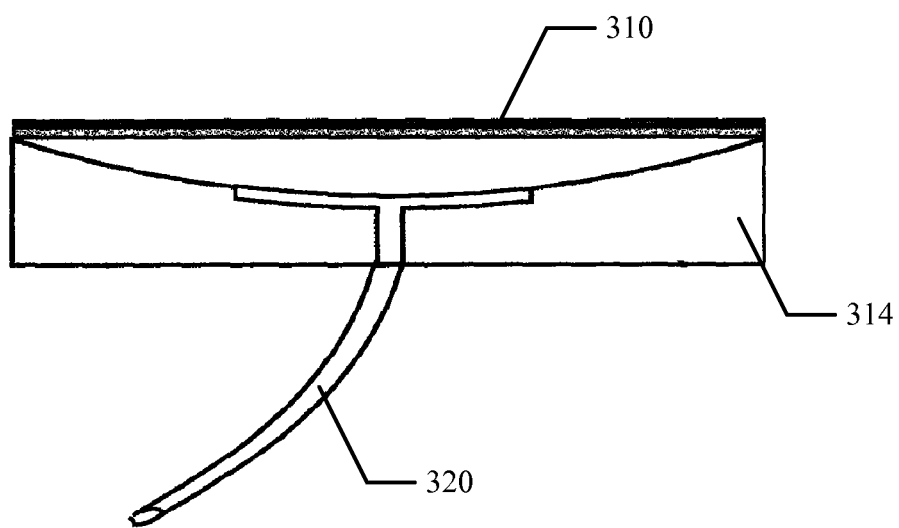
FIGS. 3A and 3B show a concave target according to one embodiment of the invention.
Figure 3B:
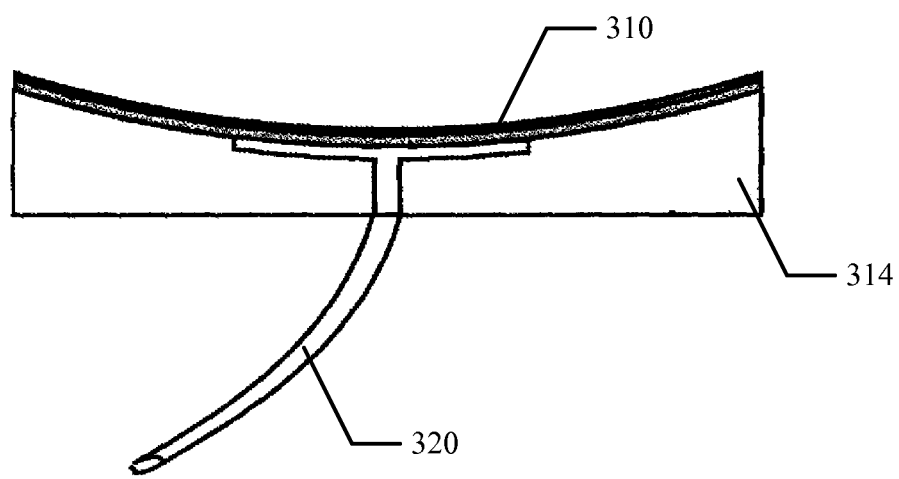

Another solution to theses non-planar effects is to use a concave target 314 according to another embodiment of the invention as shown in FIGS. 3A and 3B. FIG. 3A shows a substrate 310 on a concave target 314. The concave target 314 is coupled with a vacuum line 320 that is attached to a vacuum pump (not shown). In FIG. 3A the vacuum pump is not activated. FIG. 3B shows the concave target 314 with the vacuum pump activated. Activating the vacuum pump pulls the substrate 310 into the concave target 314. By pulling the substrate 310 into the concave target the spherical non-planar effects discussed above may be mitigated. The concave substrate may be spherically concave.

The interference lithography system shown in FIG. 1 may be augmented with three, four or more light beams, and various mirrors and optics. Using three beams may provide a pattern with hexagonal symmetry. A four beam system provides a pattern with rectangular symmetry. Such systems may be used to provide more alternatives to the type of patterns exposed at the target.

For example, the system may use a four beam configuration according to one embodiment of the invention. The first and third beams and their optical paths may be aligned within one plane and the second and fourth beams may be aligned within another plane that is orthogonal to the first plane. The beams may be directed toward a nonlinear photoresist where they interfere and create an interference pattern. Pockels Cells or other phase modulating devices may be used to control the phases of the various beams of light. For example, the phase difference between the first and third beams ($\Delta\phi_1^{13}$) and the second and fourth beams ($\Delta\phi_1^{24}$) may be set during a first exposure. Using, for example, Pockels Cells, the phase difference between the light beams may be adjusted so that the phase difference between the first and third beams and/or the second and fourth beams are 90° to 270° from the phase difference in the first exposure. FIG. 1A shows an example of a four beam lithography system.

According to one embodiment of the invention, the intensity of the interference pattern is function of the angle between the incident beams of light and the position at the target according to the following two equations. For T-E polarized light:

$$I(x,z)=4I+2I\{\cos(2kx\cos\theta+\Delta\phi_{12})+\cos(2kz\cos\theta+\Delta\phi_{34})\},$$

and for T-M polarized light:

$$I(x, z) = 4I - 2I\cos(2\theta)\{\cos(2kx\cos\theta + \Delta\varphi_{12}) +$$
$$\cos(2kz\cos\theta + \Delta\varphi_{34})\} - 2I\cos^2\theta\{\cos(k(x - z)$$
$$\cos\theta + \Delta\varphi_{13}) + \cos(k(x - z)\cos\theta + \Delta\varphi_{42})\} +$$
$$2I\cos^2\theta\{\cos(k(x + z)\cos\theta + \Delta\varphi_{14}) +$$
$$\cos(k(x + z)\cos\theta + \Delta\varphi_{32})\}.$$

Where $\Delta\phi_{ij}=\phi_i-\phi_j$ and $\theta$ is the incident angle of light for all four beams as measured from the horizontal. For unpolarized light, assuming no phase difference $\Delta\phi_{ij}=0$:

$$I(x,z)=4I+2I\{\cos(2kx\cos\theta)+\cos(2kz\cos\theta)+2\cos(k(x-z)\cos\theta)+2\cos(k(x+z)\cos\theta)\}.$$

Figure 6A:
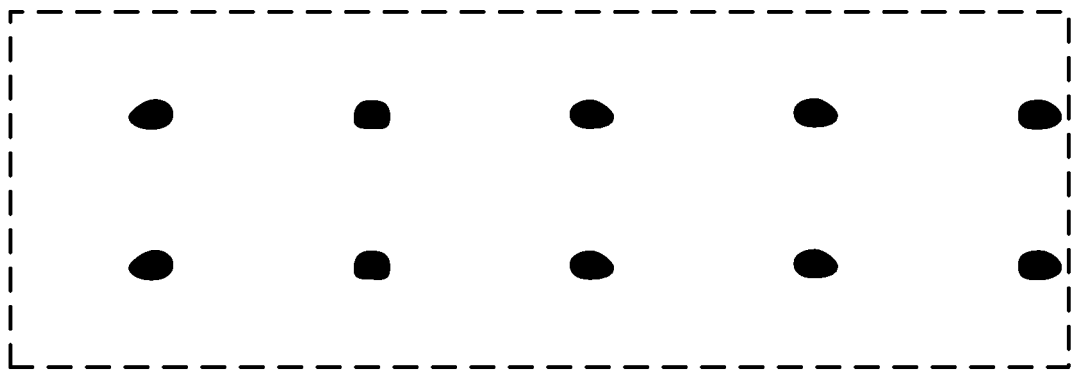
FIGS. 6A, 6B and 6C show representations of latent or real images with two exposures using four light beams according to another embodiment of the invention.
Figure 6B:
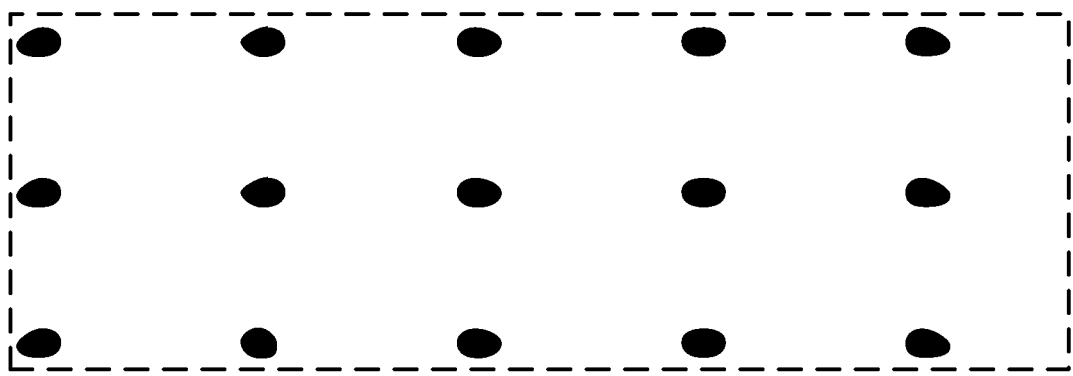
Figure 6C:
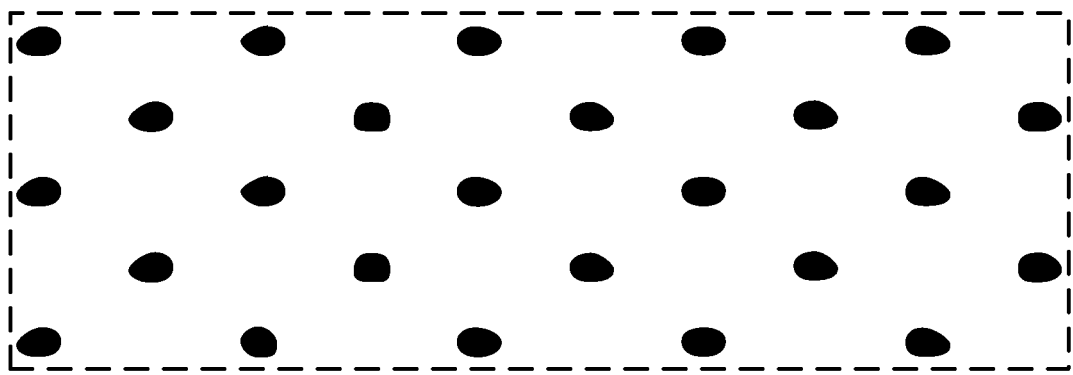

FIGS. 6A, 6B and 6C show representations of latent or real images with two exposures using four light beams according to another embodiment of the invention. FIG. 6A shows a pattern resulting from a first exposure of a nonlinear photoresist using four beam interference lithography. FIG. 6B shows the pattern from a second exposure. Assuming the first and third beams are within one plane and the second and fourth beams are in an orthogonal plan, in one example, the phase difference between the first and third beams in the second exposure is 180° (±10%) from the difference between the first and third beams in the first exposure ($\Delta\phi_2^{13}=\Delta\phi_1^{13}+180°$). Likewise, the phase difference between the second and fourth beams in the second exposure is 180° (±10%) from the difference between the second and fourth beams in the first exposure ($\Delta\phi_2^{24}=\Delta\phi_1^{24}+180°$). The combined pattern is shown in FIG. 6C. FIG. 1A shows an example of a four beam lithography system.

Figure 7A:
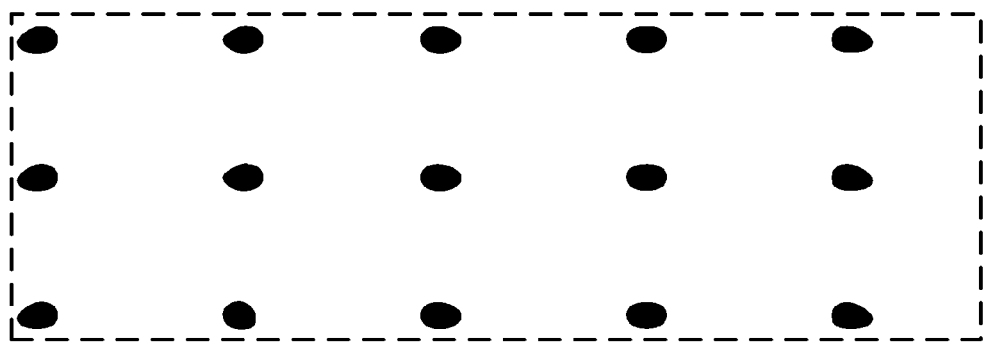
FIGS. 7A, 7B, 7C, 7D, 7E, 7F and 7G show representations of latent or real images using four exposures using four light beams according to another embodiment of the invention.
Figure 7B:
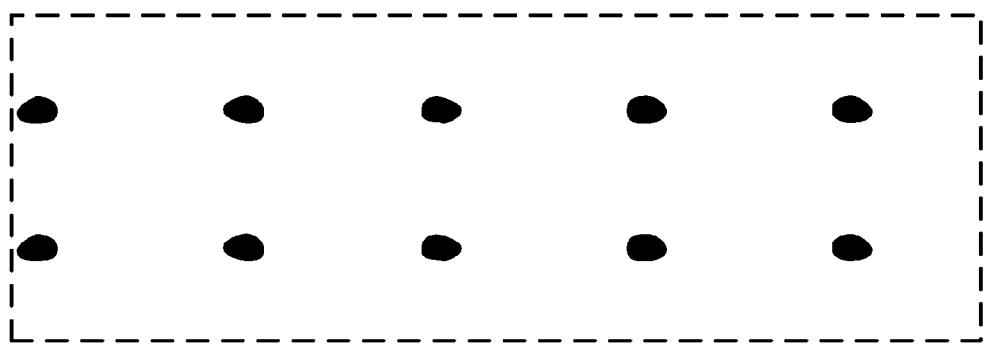
Figure 7C:
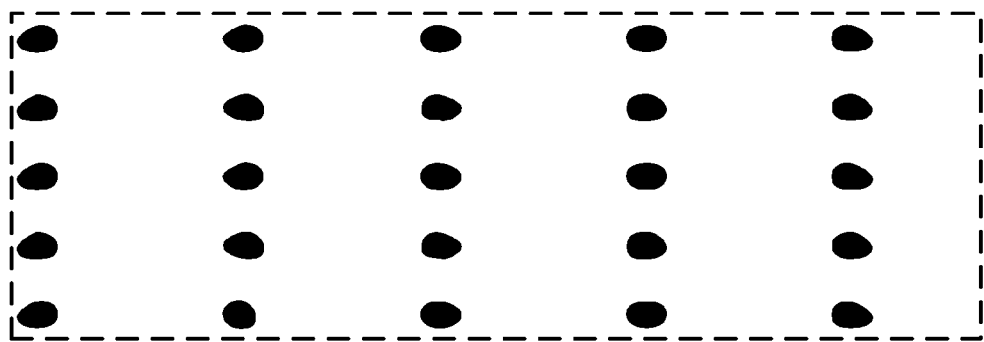

FIGS. 7A, 7B, 7C, 7D, 7E, 7F and 7G show representations of latent or real images using four exposures using four light beams according to another embodiment of the invention. FIG. 7A shows a pattern resulting from a first exposure of a nonlinear photoresist using four beam interference lithography. In this embodiment, the first and third beams are coplanar and orthogonal to the coplanar second and fourth beams. The first and third beams have a phase difference of $\Delta\phi_1^{13}$ and the second and fourth beams have a phase difference of $\Delta\phi_1^{24}$. FIG. 7B shows a second exposure where the phase difference between the first and third beams is 180° from the phase difference first and third beams in the first exposure. That is, $\Delta\phi_2^{13}=\Delta\phi_1^{13}+180°$. The second and fourth beams have the same phase difference ($\Delta\phi_2^{24}=\Delta\phi_1^{24}$). FIG. 7C shows the combined pattern. FIG. 1A shows an example of a four beam lithography system.

Figure 7D:
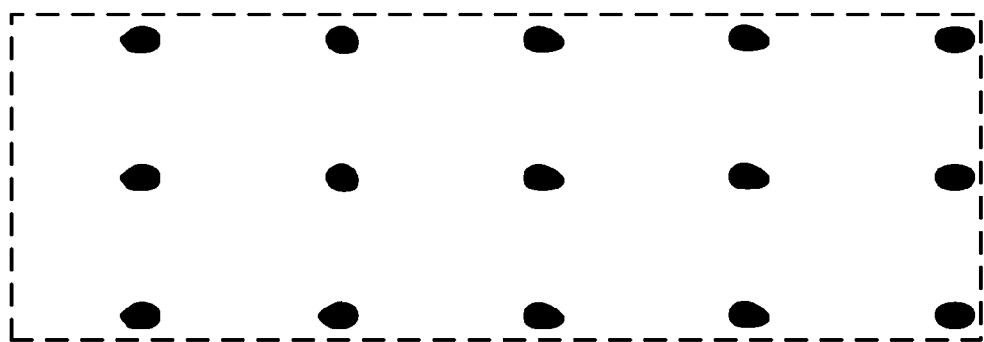
Figure 7E:
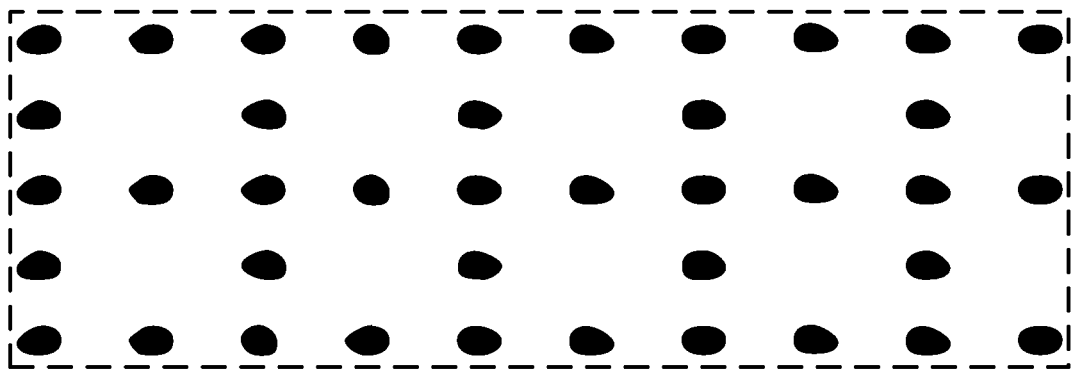

FIG. 7D shows a third exposure where the phase difference between the second and fourth beams is 180° from the phase difference second and fourth beams in the first exposure. That is, $\Delta\phi_3^{24}=\Delta\phi_1^{24}+180°$. The first and third beams have the same phase difference as the first exposure ($\Delta\phi_3^{13}=\Delta\phi_1^{13}$). FIG. 7E shows a combined pattern with the first, second and third exposures.

Figure 7F:
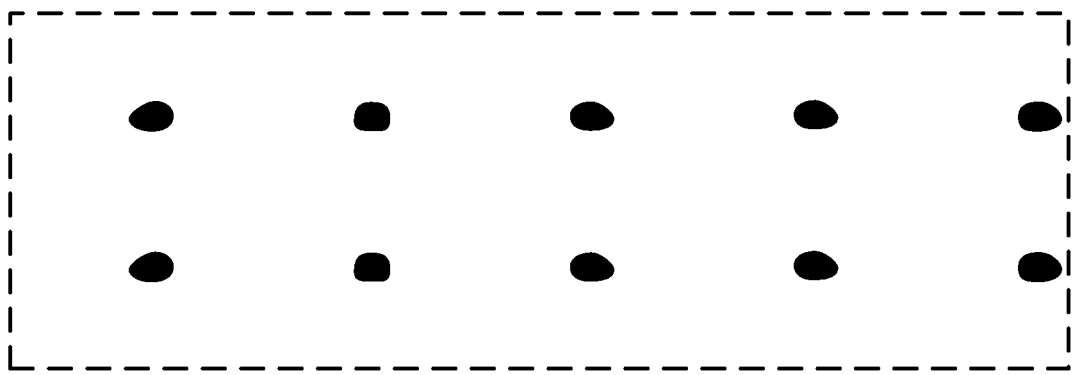
Figure 7G:
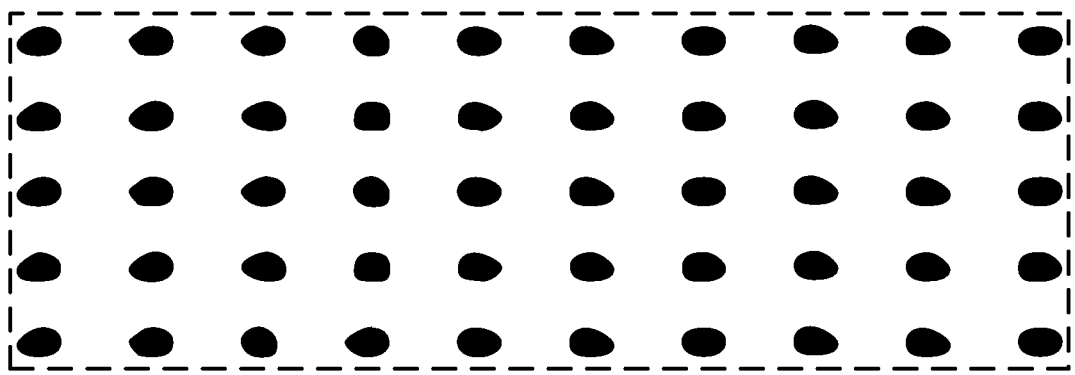

FIG. 7F shows a fourth exposure where both the phase difference between the first and third beams and the phase difference between the second and fourth beams is 180° from the phase differences in the first exposure. That is $\Delta\phi_3^{24}=\Delta\phi_1^{24}+180°$ and $\Delta\phi_2^{13}=\Delta\phi_1^{13}+180°$. FIG. 7G shows the combined pattern.

Of course the size of the various exposures in any of the embodiments described herein may be adjusted by changing the exposure time and/or the threshold of the nonlinear photoresist.

While embodiments of the invention have been described using an interferometer similar to a Mach-Zehnder interferometer (as shown in FIG. 1), other interferometers may be used without deviating from the spirit of the invention. For example, a Lloyd's-Mirror interferometer or a grating interferometer may be used. These interferometers may employ various other optical elements as needed. Other interferometers may also be used that provide an interference pattern on a nonlinear photoresist that may be shifted by adjusting the phase difference between the light beams.

While some of tolerances have been disclosed above, in generally angles and other measurements may be within ±10% of the disclosed amount.

While the principles of the disclosure have been described above in connection with specific apparatuses and methods, it is to be clearly understood that this description is made only by way of example and not as limitation on the scope of the disclosure.

What is claimed is:

1. An interference lithography system comprising:
   a nonlinear photoresist, wherein the nonlinear photoresist does not integrate energies of consecutive exposures;
   a light source, wherein the light source produces a beam of substantially coherent light;
   an optical splitter within the path of the beam of coherent light, wherein the optical splitter splits the beam of coherent light into a plurality of beams of substantially coherent light;
   a plurality of mirrors, wherein each mirror reflects a beam of light from the plurality of beams of light towards the nonlinear photoresist;
   a phase difference sensor that detects the phase difference between the plurality of beams of substantially coherent light; and
   a Pockels cell disposed within the optical path of at least one of the plurality of beams of substantially coherent light, wherein the Pockels cell is in communication with the phase difference sensor such that the phase difference sensor communicates a phase error to the Pockels cell,
   wherein the interference lithography system is adapted to expose the nonlinear photoresist with a first exposure with a first phase difference between the plurality of beams of light, the interference lithography system is adapted to expose the nonlinear photoresist with a second exposure with a second phase difference between the plurality of beams of light, the first phase difference and the second phase difference are not equal, and the difference between the first phase difference and the second phase difference is between about 70° and 270°, and wherein a half pitch of the exposures is below the Rayleigh limit.

2. The interference lithography system of claim 1, wherein the Pockels cell varies the optical path of a light beam traveling through it, according to an applied voltage.

3. The interference lithography system of claim 1, wherein the difference between the first and second phase differences is about 180°.

4. The interference lithography system of claim 1, wherein the difference between the first and second phase differences is about 90°.

5. The interference lithography system of claim 1, wherein the difference between the first and second phase differences is about 72°.

6. The interference lithography system of claim 1, wherein the nonlinear photoresist comprises an aluminum oxide.

7. The interference lithography system of claim 1, wherein the coherent light source comprises an excimer laser.

8. The interference lithography system of claim 1, wherein the optical splitter splits the beam of coherent light into two beams of coherent light.

9. The interference lithography system of claim 1, wherein the optical splitter splits the beam of coherent light into three beams of coherent light.

10. The interference lithography system of claim 1, wherein the optical splitter splits the beam of coherent light into four beams of coherent light.

11. A method for exposing a nonlinear photoresist using an interferometer, the method comprising:
    exposing the nonlinear photoresist with a first exposure, wherein the first exposure includes directing a first coherent light beam and a second coherent light beam toward the nonlinear photoresist with a first phase difference between the first light beam and the second light beam, wherein the nonlinear photoresist does not integrate energies of consecutive exposures; and
    exposing the nonlinear photoresist with a second exposure, wherein the second exposure includes directing the first coherent light beam and the second coherent light beam toward the nonlinear photoresist with a second phase difference between the first light beam and the second light beam, wherein the first phase difference and the second phase difference are not equal, and wherein the difference between the first phase difference and the second phase difference is between about 70° and 290°, wherein a half pitch of the exposures is below the Rayleigh limit.

12. The method according to claim 11, wherein the difference between the first phase difference and the second phase difference is about 180°.

13. The method according to claim 11, further comprising exposing the nonlinear photoresist with a third exposure, wherein the third exposure includes directing the first coherent light beam and the second coherent light beam on the nonlinear photoresist with a third phase difference between the first light beam and the second light beam and the difference between the second phase difference and the third phase difference is between about 70° and 290°.

14. The method according to claim 13, wherein the difference between the second phase difference and the third phase difference is about 120°.

15. The method according to claim 13, further comprising exposing the nonlinear photoresist with a fourth exposure, wherein the third exposure includes directing the first coherent light beam and the second coherent light beam on the nonlinear photoresist with a fourth phase difference between the first light beam and the second light beam and the difference between the third phase difference and the fourth phase difference is between about 70° and 290°.

16. The method according to claim 15, wherein the difference between the third phase difference and the fourth phase difference is about 90°.

17. The method according to claim 11, further comprising:
measuring the phase difference of the first and second light beams;
calculating the voltage required to adjust the phase difference between about 70° and 290° using a Pockels cell; and
applying the calculate voltage to a Pockels cell.

18. The method according to claim 11, wherein the first exposure exposes the nonlinear photoresist for a set period of time.

19. The method according to claim 11, wherein the second exposure exposes the nonlinear photoresist for a set period of time.

20. The method according to claim 11, further comprising exposing the nonlinear photoresist with a third coherent light beam.

21. The method according to claim 20, further comprising exposing the nonlinear photoresist with a fourth coherent light beam.

22. A method for exposing a nonlinear photoresist using an interferometer, the method comprising:
providing a coherent light source;
splitting the coherent light source into a first light beam and a second light beam;
measuring a first phase difference between the first light beam and the second light beam;
exposing the nonlinear photoresist with the first light beam and the second light beam for a first time period, wherein the nonlinear photoresist does not integrate energies of consecutive exposures;
adjusting the phase difference between the first light beam and the second light beam according to a second phase difference, wherein the first phase difference and the second phase difference are not equal, and wherein the difference between the first phase difference and the second phase difference is between about 70° and 290°; and
exposing the nonlinear photoresist with the first light beam and the second light beam for a second time period, wherein a half pitch of the exposures is below the Rayleigh limit.

23. The method according to claim 22, wherein the adjusting further comprises applying a voltage to a Pockels cell, wherein the Pockels cell is within the optical path of one of the first or second light beams.

24. A method for exposing a nonlinear photoresist using an interferometer, the method comprising:
providing a first light beam, a second light beam, a third light beam and a fourth light beam, wherein the first and second light beams are in a first plane, the third and fourth light beams are located in a second plane, and the first plane and the second plane are substantially orthogonal;
exposing the nonlinear photoresist with a first exposure, wherein the nonlinear photoresist does not integrate energies of consecutive exposures, wherein the first exposure includes directing the first, second, third and fourth light beams on the nonlinear photoresist with a first phase difference between the first light beam and the second light beam and a second phase difference between the third light beam and the fourth light beam, wherein the first phase difference and the second phase difference are not equal, and
exposing the nonlinear photoresist with a second exposure, wherein the second exposure includes directing the first, second, third and fourth light beams on the nonlinear photoresist with a third phase difference between the first light beam and the second light beam and a fourth phase difference between the third light beam and the fourth light beam, wherein a half pitch of the exposures is below the Rayleigh limit.

25. The method according to claim 24, wherein the difference between the first phase difference and the third phase difference is about zero and the difference between the second phase difference and the fourth phase difference is about 180°.

26. The method according to claim 24, wherein the difference between the first phase difference and the third phase difference is about 180° and the difference between the second phase difference and the fourth phase difference is about 180°.

27. The method according to claim 24, wherein the difference between the first phase difference and the third phase difference is about 180° and the difference between the second phase difference and the fourth phase difference is about zero.

28. A method for exposing a nonlinear photoresist using an interferometer, the method comprising:
providing a first light beam, a second light beam, a third light beam and a fourth light beam, wherein the first and second light beams are in a first plane, the third and fourth light beams are located in a second plane, and the first plane and the second plane are substantially orthogonal;
exposing the nonlinear photoresist with a first exposure, wherein the nonlinear photoresist does not integrate energies of consecutive exposures, wherein the first exposure includes directing the first, second, third and fourth light beams on the nonlinear photoresist with a first phase difference between the first light beam and the second light beam and a second phase difference between the third light beam and the fourth light beam, wherein the first phase difference and the second phase difference are not equal, and
exposing the nonlinear photoresist with a second exposure, wherein the second exposure includes directing the first, second, third and fourth light beams on the nonlinear photoresist with a third phase difference between the first light beam and the second light beam and a fourth phase difference between the third light beam and the fourth light beam, the difference between the first and third phase differences is about zero, and the differences between the second and fourth phase differences is about 180°
exposing the nonlinear photoresist with a third exposure, wherein the third exposure includes directing the first, second, third and fourth light beams on the nonlinear photoresist with a fifth phase difference between the first light beam and the second light beam and a sixth phase difference between the third light beam and the fourth light beam, the difference between the first and fifth phase differences is about 180°, and the differences between the second and sixth phase differences is about 180°; and
exposing the nonlinear photoresist with a fourth exposure, wherein the fourth exposure includes directing the first, second, third and fourth light beams on the nonlinear photoresist with a seventh phase difference between the first light beam and the second light beam and an eighth phase difference between the third light beam and the fourth light beam, the difference between the first and seventh phase differences is about 180°, and the differences between the second and eighth phase differences is about zero, wherein a half pitch of the exposures is below the Rayleigh limit.

* * * * *